United States Patent [19]

Tracy et al.

[11] Patent Number: 4,687,560
[45] Date of Patent: Aug. 18, 1987

[54] METHOD OF SYNTHESIZING A PLURALITY OF REACTANTS AND PRODUCING THIN FILMS OF ELECTRO-OPTICALLY ACTIVE TRANSITION METAL OXIDES

[75] Inventors: C. Edwin Tracy; David K. Benson; Marta R. Ruth, all of Golden, Colo.

[73] Assignee: The United States of America as represented by the United States Department of Energy, Washington, D.C.

[21] Appl. No.: 766,169

[22] Filed: Aug. 16, 1985

[51] Int. Cl.[4] .......................... C22D 7/08; C05D 7/00
[52] U.S. Cl. ..................................... 204/164; 427/38; 427/39; 427/74
[58] Field of Search ..................... 204/164; 427/38, 39

[56] References Cited

U.S. PATENT DOCUMENTS

| | | | |
|---|---|---|---|
| 3,438,720 | 4/1969 | Cleaver | 23/1 |
| 3,464,792 | 9/1969 | Herriman et al. | 23/202 |
| 3,625,846 | 12/1971 | Murdoch et al. | 204/164 |
| 3,801,355 | 4/1974 | Van Cakenbergh | 117/931 GD |
| 3,840,750 | 10/1974 | Davis et al. | 204/164 |
| 3,875,068 | 4/1975 | Mitzel | 204/164 |
| 3,907,616 | 9/1975 | Wiemer | 204/164 |
| 4,022,872 | 5/1977 | Carson et al. | 423/297 |
| 4,242,188 | 12/1980 | Niinomi et al. | 204/164 |
| 4,361,114 | 11/1982 | Gurev | 118/723 |
| 4,540,607 | 9/1985 | Tsao | 427/39 |

OTHER PUBLICATIONS

Deb, Applied Optics Supplement B, 1969, pp. 192-195.
Zeller et al, Appl. Phys. 13 (1977), pp. 231-237.
Lampert, Solar Energy Materials 11 (1984), pp. 1-27.
Faughnan et al, Display Devices, Spring Verlag, Berlin, 1980, pp. 181-211.
Beni et al, Advances in Image Pickup & Display, vol. 5, 1982, Academic Press, pp. 83-135.
Colton et al, Accounts of Chemical Research 11 (1978), pp. 170-176.
Chemsedding, Solid State Ionic 9 & 10 (1983), pp. 357-362.

Primary Examiner—Arthur P. Demers
Attorney, Agent, or Firm—Kenneth L. Richardson; John M. Albrecht; Judson R. Hightower

[57] ABSTRACT

A method of synthesizing electro-optically active reaction products from a plurality of reactants by inducing a reaction by plasma deposition among the reactants. The plasma reaction is effective for consolidating the reactants and producing thin films of electro-optically active transition metal oxides.

9 Claims, 1 Drawing Figure

METHOD OF SYNTHESIZING A PLURALITY OF REACTANTS AND PRODUCING THIN FILMS OF ELECTRO-OPTICALLY ACTIVE TRANSITION METAL OXIDES

CONTRACTUAL ORIGIN OF THE INVENTION

The U.S. Government has rights in this invention pursuant to Contract No. DE-AC02-83-CH10093 between the U.S. Department of Energy and the Solar Energy Research Institute, a Division of the Midwest Research Institute.

BACKGROUND OF THE INVENTION

1. Field of the Invention

The present invention relates generally to the fabrication of thin films and more particularly to a new and improved method of producing thin films of electro-optically active transition metal oxides by plasma deposition.

2. Description of the Prior Art

The phenomenon of electrochromism in tungsten trioxide ($WO_3$) was first reported by S. K. Deb in Applied Optics, Supplement 3, Electrophotography, (1969) page 192. Electrochromism is known by those skilled in the art to be a color change in a material or material system caused by an applied electric potential. The color change is either the result of the formation of color centers or is caused by an electrochemical reaction that produces a colored compound. The intensity of coloration depends on the magnitude of the electric potential and the amount of time during which the material is exposed. Coloration by an applied electric potential may be either cathodic or anodic depending upon whether coloration commences at the cathode or anode, respectively. Although the transition metal oxides, when viewed as a class of materials, are generally known to exhibit electrochromism, these materials may or may not be electro-optically active depending on their method of synthesis. An electro-optically active material is one that optically responds to an applied electric potential when incorporated into an electrochromic device.

Electrochromic display devices in which amorphous $WO_3$ thin films are utilized have been studied by Colton, et. al., "Photochromism and Electrochromism in Amorphous Transition Metal Oxide Films" Accounts of Chemical Research, Volume 11 (1978), pages 170-6; "Faughnan, et al"., "Electrochromic Displays Based On $WO_3$", Display Devices, J. Pankove Ed. (1980), page 181, Springer Verlag, New York; and Beni, et al., Ion Insertion Electrochromic Displays Advances in Image Pickup and Display, volume 5 (1982) pages 83-136, Academic Press, New York.

Research relating to the application of the electrochromic effect in transistion metal oxides is being actively pursued because of its potential use in solar technology. DiPaola, et al. ["Electrochromism in Anodically Formed Tungsten Oxide Films," Journal of Electrochemical Society, volume 125, number 8, (1978) pages 1344-47] and Chemseddine, et al. ["Electrochromism of Colloidal Tungsten Oxide, Solid State Ionics, volumes 9 & 10 (1983) pages 357-362] disclosed techniques for preparing or synthesizing electro-optically active thin films of electrochromic tungsten oxide called anodization and sol-gel technology, respectively. Anodization is a process in which an electrochromic coating is anodically formed. Sol-gel technology produces an oxide coating by depositing a colloidal solution onto a substrate. The techniques just described are wet-chemical techniques which do not lend themselves to mass production because of their costs, their prospect of chemical pollution, and their relative incompatibility for fabricating solid-state electrochromic devices. Consequently, they have recently received only slight attention and investigation in the art.

In November 1984 C. M. Lampert ["Electrochromic Materials and Devices for Energy-Efficient Windows," Solar Energy Materials, 11 (1984), pages 1-27] reviewed two physical vapor deposition techniques for producing electrochromic thin films, namely vacuum evaporation and sputtering. These two techniques are presently preferred because they are relatively inexpensive in comparison to wet-chemical techniques and lend themselves readily to fabrication of solid-state electrochromic devices.

In the vacuum evaporation and sputtering deposition techniques, thin films of $WO_3$ are deposited in a vacuum environment from sources of W or $WO_3$ in an oxidizing atmosphere. In the vacuum evaporation technique, the source material is heated to a vapor pressure sufficient to cause evaporation and condensation of the material onto a substrate. In the sputtering technique, the source material is converted to the vapor phase by positive ion bombardment. Thin film deposits of the $WO_3$ are formed in both cases by vapor condensation onto a substrate in the vacuum chamber. The term vapor pressure used here is the pressure exerted when a solid or liquid is in equilibrium with its own vapor.

Electrochromic devices with thin film $WO_3$ deposits may or may not be electro-optically active depending on their deposition process and their deposition parameters. H. R. Zeller and H. U. Beyler ["Electrochromism and Local Order in Amorphous $WO_3$," Applied Physics, 13, (1977), pages 231-237] found little or no electrochromism in their $H^+$ and $Li^+$ insertion-type devices prepared with reactively sputtered $WO_3$ films from a W target in a partial pressure of Ar and $O_2$ gas. Evaporated films prepared at substrate temperatures of 300° C. also exhibited no electrochromism. Furthermore, electrochromic devices utilizing $WO_3$ films prepared by spraying meta tungstic acid at substrate temperatures of 320° C. were electro-optically inactive.

Both evaporation and sputtering techniques are intrinsically high-vacuum techniques requiring vapor pressures in the range of $10^{-6}$ to $10^{-3}$ torr. A torr is a unit of pressure that equals $1.316 \times 10^{-6}$ atmosphere. Those skilled in the art recognize that sophisticated, expensive vacuums and other equipment are required to produce pressures in this $10^{-6}$ to $10^{-3}$ torr range. Moreover, those skilled in the art understand that these techniques require additional power sources for multiple targets and for substrate heating, which to foster deposition.

Plasma chemistry is a technique by which thin films can, be produced by synthesizing reaction products from several ionized gaseous reactants. Plasma as used in this invention, is an electrically neutral, highly ionized gas composed of ions, electrons, and neutral particles. Generally, plasma deposition occurs when an electrical discharge in a low-pressure mixture of volatile reactants causes the formation of a variety of highly energetic species, e.g., atoms, metastables, radicals, ions, and the like, which chemically interact to produce stable deposits.

SUMMARY OF THE INVENTION

In the plasma deposition technique of the present invention, the electron temperature of the plasma is one to two orders of magnitude, i.e., 10 to 100 times, greater than the temperature of the gas. Thus, chemical synthesis derived by the plasma deposition method of the present invention can be achieved at near ambient temperatures and in many cases without the need for auxiliary substrate heating.

Plasma deposition, as contemplated by the present invention, is an inherently moderate-vacuum technique in which pressures within the range of $10^{-3}$ to 10 torr are required to induce the chemical reaction. In this regard, plasma deposition can be utilized in the present invention to form thin films of electrochromic tungsten oxide (WO) with relatively inexpensive and simple apparatuses in comparison to physical vapor techniques. Thin films of transition metal oxides produced by the plasma deposition technique of the present invention exhibit electrochromic response and can be fabricated into a variety of electrochromic devices including solid-state and liquid electrolyte configurations.

It has been suggested that electrochromic devices, which optically modulate solar transmission through windows can provide increased control over solar gain and daylighting. Electrochromic coatings produced by the plasma deposition technique of the present invention may be utilized to fabricate windows for use in buildings. Such electro-optically controlled windows would be compatible with dynamic computer sensing for precise remote control and would provide improved overall lighting/heating/cooling efficiencies throughout the building.

The primary object of the present invention is to provide a new and improved method of synthesizing electro-optical reaction products from a plurality of reactants by plasma deposition and inducing a reaction effective for consolidating the reactants and producing thin films of electro-optically active transition metal oxides.

An additional object of the present invention is to provide a new and improved method of synthesizing electro-optical reaction products from using a plurality of reactants by a moderate-vacuum deposition technique.

A further object of the present invention is to provide a new and improved method of synthesizing a plurality of reactants by an enhanced rate of deposition in comparison to conventional techniques.

Another object of the present invention is to provide a new and improved method of synthesizing electro-optically active thin film products from a plurality of reactants by inducing a plasma reaction effective for consolidating the reactants and producing electro-optically active thin films of transition metal oxides.

In accordance with the principles of the present invention, the structure to which the inventive method is applied in one specific example comprises a reaction chamber adapted to synthesize electro-optically thin film products from a plurality of gaseous reactants so as to produce thin films of electro-optically active transition metal oxides. The synthesizing process is generally achieved by inducing a plasma reaction among the reactants over a predetermined deposition period and under a carefully selected set of thermodynamic conditions.

To carry out the novel method, a first gaseous reactant is inserted into the reaction chamber with a system vacuum pressure. Second and third gaseous reactants including a transition metal-bearing gas and an oxygen-bearing gas, are introduced into the chamber. The combination of the reaction chamber pressure and the vapor pressures of the gases inserted into the chamber establish a system pressure substantially less than atmospheric pressure. A plasma reaction is induced within the chamber and among the reactants over a predetermined deposition period effective for consolidating the reactants and producing thin films of electro-optically active transition metal oxides.

Additional objects, advantages, and novel features of the invention shall be set forth in part in the description that follows and will become apparent to those skilled in the art upon examination of the following or may be learned by the practice of the invention. The objects and advantages of the invention may be realized and attained by means of the instrumentalities and in combinations particularly pointed out in the appended claims.

BRIEF DESCRIPTION OF THE DRAWING

The accompanying drawing, which is incorporated in and forms a part of the specification, illustrates the present invention and, together with the description, explains to explain the principles of the invention.

In the drawing.

DETAILED DESCRIPTION OF THE INVENTION

Figure 1:
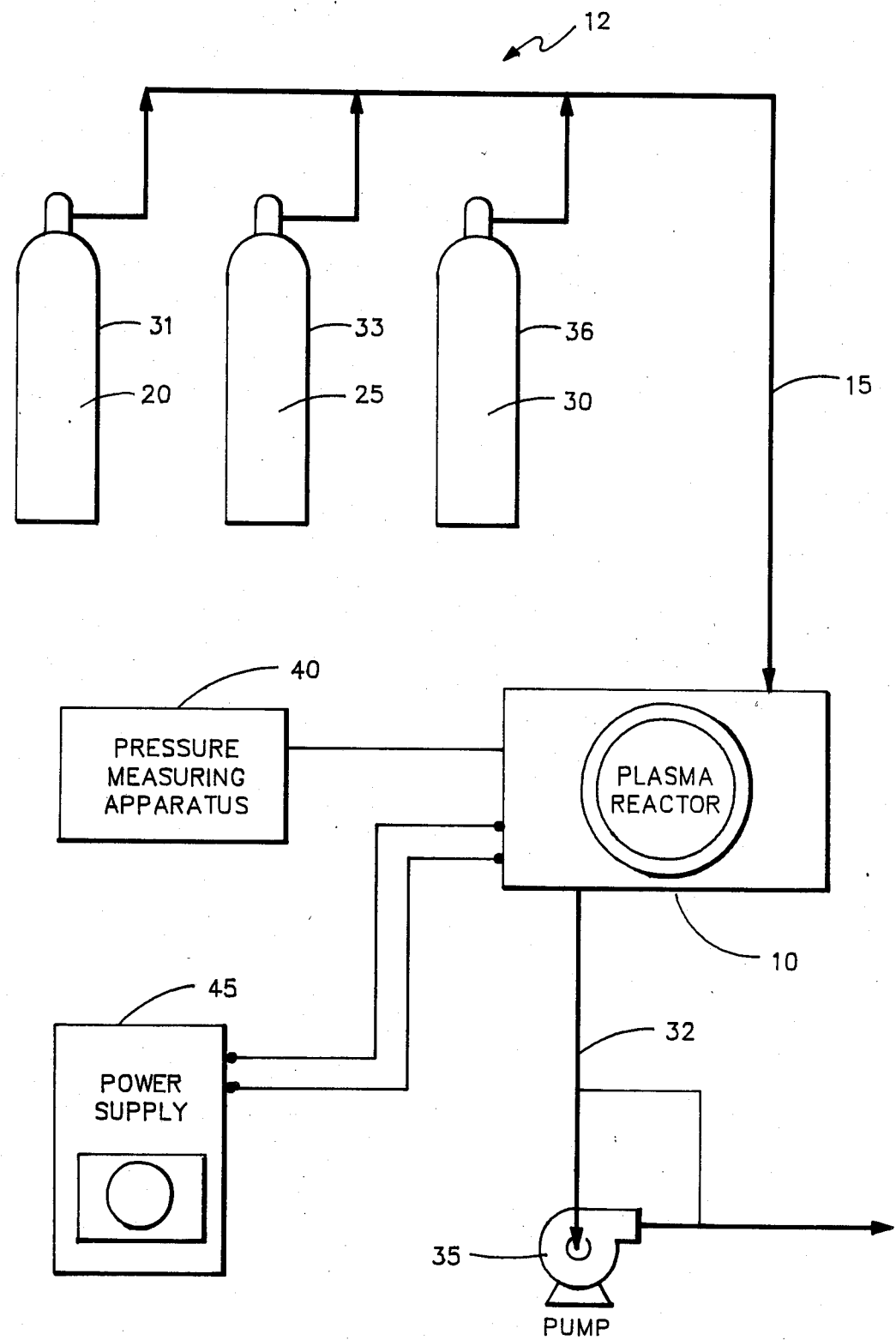
FIG. 1 is a diagrammatic representation of a preferred synthesizing apparatus and associated equipment in accordance with the present invention.

With reference now to the drawing, a reaction chamber 10, in the form of a hollow, metallic structure is shown and is seen to have a generally rectangular cross-section. It will be understood, however, that the invention is likewise applicable to reaction chambers or other structures with different cross-sectional configurations.

FIG. 1 illustrates an embodiment of an apparatus for synthesizing thin films of transition metal oxides. As shown, the primary input 12 to the chamber 10 comprises a pipe 15 through which reactants 20, 25, and 30 are pumped from canisters 31, 33, and 36, respectively. Output 32 is secured to the pump 35 through which gaseous by-products are withdrawn from the chamber 10. Auxiliary or secondary inputs 40 and 45 are attached to a pressure measuring apparatus and a power supply, respectively. The power suppy includes means (not shown) for adjusting the frequency and power supplied to the chamber 10. While the thin films are actually synthesized in the chamber 10, which is distinctly separated from the primary input 12, it will be clear that the canisters in which the reactants are disposed may be situated within the chamber. A pump 35 is adapted to withdraw gases from the chamber 10 before and after the deposition sequence.

The preferred state of the reactants disclosed in the present invention is gaseous. The gaseous form of the reactants is known to foster mixing and chemical reaction with other constituents. Because of the nature of the gaseous form of the reactants, the electro-optic properties of the desired transition metal oxide can be more easily tailored or controlled without using additional power supplies, targets, vacuum fixtures, and the like, which are required in high-vacuum evaporation and sputtering techniques.

In accordance with the principles of the present invention, a base pressure approximating 0.013 torr is initially established in the chamber 10. A first reactant, preferably argon gas, is inserted into the chamber 10. This first reactant predominately acts to promote ionization and subsequent deposition of the primary metal-bearing and oxygen-bearing reactants. In this invention, the desired gases are a volatile transition metal compound such as tungsten hexafluoride ($WF_6$) and oxygen ($O_2$) for reactants 25 and 30. Reactants 25 and 30 having a preselected volume ratio (i.e., $WF_6/O_2$) are then imparted into the chamber 10. Tungsten hexafluoride is relatively unique among tungsten-bearing compounds in that with a boiling point of 17.5° C., it exists as a gas at room temperature. In the gaseous state, $WF_6$ can, without heating, be readily admitted into the chamber 10 for subsequent reaction with oxygen to form the transition metal oxide (herein $WO_3$). It is significant that the vapor pressures of the reactants must be sufficient to effectuate the synthesizing process. The reactants must possess a sufficient vapor pressure to be admitted into the reaction chamber in gaseous form and be thermodynamically capable of reaction to form a stable oxide.

While $WF_6$ and $O_2$ are favored reactants, it will be appreciated that other metal-bearing compounds and oxygen-bearing compounds are within the scope of the present invention. By way of example, moderate-vapor pressure tungsten compounds capable of plasma oxidation, i.e., existing as solids or liquids, may be utilized as reactants. In a commonly known experimental technique, compounds with boiling points less than 500° C. can be dynamically heated in situ under vacuum to raise their vapor pressures to sufficient levels to foster gaseous transport into the chamber 10. Examples of tungsten-bearing compounds include, but are not limited to, tungsten organometallics (such as tungsten carbonyl and trimethyl tungsten), tungsten halides (e.g., $WCl_6$, $WCl_5$, $WCl_4$, $WBr_6$, $WBr_5$, $WI_2$, and $WI_4$) and tungsten oxyhalides (e.g., $WOBr_2$, $WOBr_4$, $WOCl_2$, $WOCl_4$, and $WOF_4$). Examples of oxygen-bearing compounds include but are not limited to $O_3$, $OF_2$, $H_2O$, $H_2O_2$, NO, $N_2O$.

Additional oxides exhibiting cathodic electrochromic coloration including oxides of molybdenum, vanadium, niobium, and titanium may be synthesized by plasma deposition in a fashion similar to the synthesis of $WO_3$ described earlier. Plasma reaction of appropriate moderate-vapor pressure compounds (organometallics, halides, and oxyhalides) of these metals with oxygen would also produce electro-optically active oxides. Examples of these compounds include $MoOF_4$, $MoF_6$, $VCl_4$, $VF_5$, $VOBr_3$, $VOCl_3$, $NbF_5$, $TiBr_4$, $TiCl_4$, $TiF_4$, $TiI_4$, organometallics and the like.

Moreover, oxides exhibiting anodic electrochromic coloration such as the oxides of iridium, rhenium, nickel, and cobalt may be synthesized by plasma deposition. Again, as with plasma synthesis of $WO_3$, moderate-vapor pressure compounds of iridium, rhenium, nickel, and cobalt can be utilized as metal-bearing starting reactants in combination with oxygen to form metallic oxides for use in electrochromic applications. Examples of these compounds include $IrF_6$, $ReOF_4$, $Ni(CO)_4$, $Co(NO)(CO)_3$, organometallics and the like.

The plasma deposition technique further lends itself to the synthesis of mixed-oxide electrochromic compounds such as $WO_3/MoO_3$, $WO_3/VO_3$, $WO_3/Nb_2O_5$, and the like. Precise tailoring of the electrochromic optical absorption spectrum is achieved by controlling the mixture of appropriate volatile metal-bearing compound reactants during the reactive plasma deposition. For example, plasma reaction of various ratios of $WF_6$ and $MoF_6$ metal halide reactants with oxygen results in $WO_3/MO_3$ mixed oxides having optical properties that reflect the quantitative nature of their reactant ratios.

As related above, the vapor pressures of reactants 25 and 30 are effective for establishing a predetermined system pressure, which is required to produce the proper thermodynamic conditions for igniting the plasma in chamber 10. In the present invention, the reactive plasma is preferably ignited, established, and maintained by radio-frequency (RF) power generated by a power supply 45. As was mentioned earlier, the power supply 45 contains the means for tuning the frequency of the RF power supplied to the chamber 10. The desired frequency is about 13.56 MHz for optimum thin-film fabrication. The plasma reaction is initiated within chamber 10 by applying a definite amount of energy, about 300 Watts, for a suitable deposition period. While the preferred technique for igniting the plasma is by using RF power, those skilled in the art will recognize that other means for igniting, establishing, and maintaining a plasma are within the scope of the present invention, such as direct current, low-frequency alternating current, high-frequency alternating current, microwave, and other techniques.

As explained previously, chemical synthesis is initiated when the reactants are ionized and excited by the plasma pursuant to the application of RF power to the chamber 10. With the addition of the RF power, the formation of the energetic species derived from the reactants chemcially interact to produce thin films of electro-optically active transition metal oxides. As was recited earlier, these species include atoms, metastables, free radicals, ions, and the like. As a matter of course, this thermodynamic process effectively consolidates reactants 20, 25, and 30 and produces solid deposits of transition metal oxides.

Thin films of $WO_3$ were deposited by plasma reaction onto uncoated and indium tin oxide (ITO) coated sodelime glass substrates. The ITO - coated glass substrates were subsequently fabricated into liquid electrolyte and solid-state electrochromic device configurations. The transparent/conductive ITO coating was 4500 angstroms thick and 12 ohms per square (ohms per square is a measure of surface resistance), and eventually served as one of the two electrical connections to test for electro-optic activity in the thin-film $WO_3$ deposit.

A representative plasma deposition sequence included the following steps: (1) several ITO-coated glass and plain glass substrates were cleaned with a mild detergent scrub and a deionized $H_2O$ rinse; (2) the substrates were loaded into chamber 10 which was evacuated to the desired system base pressure by pump 35; (3) $O_2$ was admitted into chamber 10, whose pressure was about 0.5 torr, and a 300 watt discharge was initiated for appoximately five minutes to preclean the substrates; (4) chamber 10 was then reevacuated to the base pressure and the speed of pump 35 was throttled, i.e., adjusted, to maintain the base pressure (this procedure minimizes waste of $WF_6$ gas), (5) reactant gases 20, 25, and 30 were admitted into chamber 10 at the desired pressures and with the preferred volume ratio between $WF_6$ and $O_2$. A capacitance manometer gauge was used to monitor the chamber pressure, however, several other devices known by those skilled in the art could also be used for measuring such gases; (6) 300 watts of RF power at approximately 13.56 MHz frequency was applied to chamber 10 by power supply 45 to ignite the plasma reaction for the desired deposition period; (7) power supply 45 was turned off and chamber 10 was again evacuated to the base pressure; (8) chamber 10 was filled with dry nitrogen, the substrates were removed, and the temperature of the substrates measured with a surface probe; (9) thin-film deposits were examined and observations recorded; and (10) ITO-coated substrates with integral thin-film WO$_3$ deposits were fabricated into liquid electrolyte and solid-state electrochromic devices and tested for electro-optic activity. While the stated order of the above steps is preferred, it will be obvious to those skilled in the art that variance in the order of one or more steps is within the scope of the present invention.

The invention can be further illustrated in the nonlimiting examples below. In each of the examples the plasma deposition technique was utilized to synthesize the desired products from gaseous reactants. Moreover, after the deposition sequence, auger and X-ray diffraction analysis confirmed that these plasma-deposited films were amorphous tungsten oxide. In the following examples the preferred reactants were used. However, it will be appreciated by those skilled in the art that thin-film deposits displaying similar electro-optic properties and features will be achieved with other reactants disclosed in this invention.

EXAMPLE 1

A base pressure of 0.013 torr was initially induced in the chamber 10 by a pump 45. The first reactant 20, herein argon, was inserted into the chamber 10 with the pressure being about 0.051 torr. Second and third reactants 25 and 30 respectively, herein WF$_6$ and O$_2$, were subsequently imparted into the chamber 10 and the system pressure was increased until a total pressure of 0.869 torr was achieved. The volume ratio between reactants 25 and 30 (WF$_6$/O$_2$) in this example was 1.52. The power supply 45 was adjusted to provide 300 watts of RF power to the chamber 10. After a seven minute deposition period, the thickness of the transition metal oxide deposit (WO$_3$) was about 2000 angstroms. After the substrate was removed from the reaction chamber, its temperature was 50° C. The thin WO$_3$ coating was transparent, insulating, and electro-optically active.

EXAMPLE 2

In this example the chamber was pumped to an initial base pressure of 0.010 torr. The first reactant 20 was not utilized in this example. However, identical second and third reactants were used as in the prior example. In this example, the volume ratio between reactants 25 and 30 was 2.8 and the total system pressure in the chamber 10 was increased to 0.735 torr. As in example 1, the power delivered to chamber 10 by the power supply 45 was 300 watts. A fourteen-minute deposition period resulted in an electro-optically active thin-film deposit of approximately 4000 angstroms thickness. The temperature of the substrate after removal from the reaction chamber was 58° C.

The following tabulation summarizes the conditions used in the examples recited. In each case 300 watts of RF power was applied to the chamber 10 by the power supply 45. Furthermore, the temperature of the thin films described in examples 1 and 2 was 50° and 58° C., respectively. The nature of the electro-optically active thin films was transparent and insulating in both examples.

| EXAMPLE | 1 | 2 |
|---|---|---|
| Base pressure (torr) | 0.013 | 0.013 |
| Argon pressure (torr) | 0.051 | Not Used |
| Total pressure (torr) | 0.869 | 0.735 |
| Deposition period (minutes) | 7 | 14 |
| WF$_6$/O$_2$ ratio | 1.52 | 2.8 |
| Thickness (angstroms) | 2000 | 4000 |

It has been experimentally demonstrated that these thin films of amorphous WO$_3$ produced by the plasma technique used in the examples were highly electro-optically active when fabricated into electrochromic liquid electrolyte and solid-state cell configurations. In several experiments, intense blue coloration and bleaching were repetitively observed in thin films of plasma-deposited WO$_3$ incorporated into a hydrogen-ion-insertion wet cell with an H$_2$O electrolyte, a hydrogen-ion-insertion solid-state cell with a dielectric MgF$_2$ layer, and a lithium-ion-insertion wet cell with a lithium tetrafluoroborate (LiBF$_4$)/propylene carbonate electrolyte.

While a preferred embodiment has been described and illustrated it will be clear to those skilled in the art that various modifications and changes are within the scope of the present invention. Thin films of electro-optically active tungsten trioxide produced by the novel method recited herein are known to have extensive commercial applications. It has already been described how these films possess properties that enable them to color with the application of an electric field. The use of other materials for the reactants has already been described. In fact, the reactants may take on other states such as solids or liquids as long as sufficient vapor pressures are maintained. Likewise, other techniques for igniting the plasma were discussed. Moreover, the orientation of the containment chamber is not limited to the embodiment described herein. It will be clear to those skilled in the art that other power levels and frequencies may be employed with a proportional modification in the size and the character of the transition metal oxide deposit.

In accordance with the principles of the present invention, the reactants are inserted into the plasma chamber by the dynamic action of the pumping system. In other words, the reactants are inserted into and pumped from the plasma chamber in a continuous motion during plasma deposition. It is also possible to practice this invention with a static pumping system; that is, one in which the pumping system is isolated from the plasma chamber after initial evacuation. In the static pumping system each reactant is inserted into the plasma chamber, the plasma is ignited and extinguished, and subsequently at the desired time the pumping system is reopened and all residual reactant gases are removed from the chamber.

From the foregoing disclosure of a preferred embodiment of the invention, it will be apparent that the invention lends itself to numerous modifications, changes, substitutions, and equivalents, all of which will be obvious to those skilled in the art. Further, portions of the method disclosed may be used without other portions, or may be interchanged without departing from the spirit and scope of the invention herein. Accordingly, it is intended that the scope of the invention be limited only by the spirit and scope of the appended claims.

What is claimed is:

1. A method of synthesizing thin films of electro-optically active transition metal oxides from a plurality of reactants in a reaction chamber, said process comprising the steps of:
   (a) inserting a first reactant into said chamber;
   (b) imparting second transition metal-bearing and third oxygen-bearing reactants into said chamber, the vapor pressures of said first, second and third reactants being effective for establishing a system pressure substantially less than atmospheric pressure; and
   (c) inducing a plasma reaction among said reactants by plasma deposition, which plasma reaction consolidates said reactants, oxidizes said transition metal-bearing reactants and produces said thin films of electro-optically active transition metal oxides.

2. A method in accordance with claim 1 wherein the inducing step comprises providing radio-frequency energy to said reactants effective for igniting said reaction.

3. A method in accordance with claim 1 wherein said metal-bearing compounds comprise tungsten hexafluoride.

4. A method in accordance with claim 1 wherein said oxygen-bearing compounds comprise oxygen.

5. A method in accordance with claim 1 wherein said metal-bearing compounds comprise moderate-vapor pressure tungsten compounds.

6. A method in accordance with claim 1 wherein said thin films comprise tungsten trioxide.

7. A method in accordance with claim 1 wherein said first, second, and third reactants comprise argon, tungsten hexafluoride, and oxygen gases, respectively.

8. A method in accordance with claim 1 wherein said chamber further comprises pressure measuring and power supply devices as secondary inputs.

9. A method of synthesizing thin films of electro-optically active transition metal oxides from argon, tungsten hexafluoride and oxygen gases in a reaction chamber, said chamber having a base pressure, said chamber further having a primary input, secondary inputs and an output, said output being secured to a pump through which gases are withdrawn from said chamber, said secondary inputs comprising a pressure measuring apparatus and a power supply for supplying power to the reaction chamber, said power supply including means for adjusting said power supplied to said chamber, said process comprising the steps of:
   (a) inserting argon gas into said chamber;
   (b) imparting tungsten hexafluoride and oxygen gases into said chamber, said gases having vapor pressures effective for establishing a system pressure substantially less than atmospheric pressure; and
   (c) inducing a plasma reaction among said gases, which plasma reaction consolidates said gases, oxidizes said tungsten hexafluoride, and produces thin films of electrooptically active tungsten trioxide.

* * * * *